United States Patent
Utsumi

(10) Patent No.: US 8,823,791 B2
(45) Date of Patent: Sep. 2, 2014

(54) COMPONENT RECOGNIZING DEVICE, SURFACE MOUNTING MACHINE, AND COMPONENT TESTING MACHINE

(75) Inventor: Tomoyoshi Utsumi, Shizuoka (JP)

(73) Assignee: Yamaha Hatsudoki Kabushiki Kaisha, Shizuoka-ken (JP)

(*) Notice: Subject to any disclaimer, the term of this patent is extended or adjusted under 35 U.S.C. 154(b) by 935 days.

(21) Appl. No.: 12/663,480

(22) PCT Filed: May 12, 2008

(86) PCT No.: PCT/JP2008/058735
§ 371 (c)(1),
(2), (4) Date: Dec. 7, 2009

(87) PCT Pub. No.: WO2008/149640
PCT Pub. Date: Dec. 11, 2008

(65) Prior Publication Data
US 2010/0171824 A1    Jul. 8, 2010

(30) Foreign Application Priority Data
Jun. 7, 2007   (JP) .................. 2007-151615

(51) Int. Cl.
*H04N 7/18* (2006.01)
(52) U.S. Cl.
USPC .............. 348/95; 348/32; 348/87; 348/90; 348/135; 348/335
(58) Field of Classification Search
CPC ........ H04N 7/18; H01L 21/681; B26D 7/018; B41F 27/005; G01B 11/00
USPC .............. 348/95; 156/580; 29/833; 399/32
IPC ................................ G02F 1/1345
See application file for complete search history.

(56) References Cited

U.S. PATENT DOCUMENTS 5,913,091 A * 6/1999 Nanba et al. .............. 399/32
5,920,397 A   7/1999 Itoh
(Continued)

FOREIGN PATENT DOCUMENTS

EP   0 808 090 A1   11/1997
JP   3186387         7/1995
(Continued)

OTHER PUBLICATIONS

International Search Report; PCT/JP2008/058735; Jun. 3, 2008.
(Continued)

*Primary Examiner* — Thao X Le
*Assistant Examiner* — Long Le
(74) *Attorney, Agent, or Firm* — Studebaker & Brackett PC

(57) ABSTRACT

To enable image recognition of a component at a high degree of accuracy in a stable manner over a long term with a component recognizing device configured to take an image of a component by moving a scan unit having an imaging device using a linear motor, and a surface mounting machine and a component testing machine each equipped with the component recognizing device. The component recognizing device includes permanent magnets (732) that are fixed to a head unit (6) in a state where surfaces (732a) opposing a coil portion (733) are faced downward. The coil portion (733) is disposed at a position directly below the permanent magnets (732). An attraction force (FM) induced between the coil portion (733) and the permanent magnets (732) therefore acts on linear guides (72) in an upward direction (+Z direction) via a bottom frame (731). On the contrary, the own weights (Fig) of a scan unit (71) and the like act in a downward direction. It thus becomes possible to ease the influence of the attraction force (Fm) applied on the linear guides (72) correspondingly to the own weights (Fg).

8 Claims, 10 Drawing Sheets

(56) References Cited

U.S. PATENT DOCUMENTS

| | | |
|---|---|---|
| 7,617,597 B2 * | 11/2009 | Okuda et al. .................... 29/833 |
| 2004/0060666 A1 * | 4/2004 | Nishino et al. ................ 156/580 |
| 2005/0111062 A1 * | 5/2005 | Fukui et al. ................... 358/514 |

FOREIGN PATENT DOCUMENTS

| | | |
|---|---|---|
| JP | 9-307297 | 11/1997 |
| JP | 11-74700 | 3/1999 |
| JP | 2004-349346 A | 12/2004 |
| JP | 2005-72621 A | 3/2005 |
| JP | 2007-504638 A | 3/2007 |
| WO | 01/95370 A2 | 12/2001 |
| WO | 2005/015972 A2 | 2/2005 |

OTHER PUBLICATIONS

Extended European Search Report dated Apr. 23, 2010; Application No./ Patent No. 08752615.8-1242 / 2152055 PCT/JP2008058735.
An Office Action; "Notice of Reasons for Rejection," drafted by the Japanese Patent Office on Apr. 1, 2011, which corresponds to JP2007-151615 and is related to U.S. Appl. No. 12/663,480; with translation.

* cited by examiner

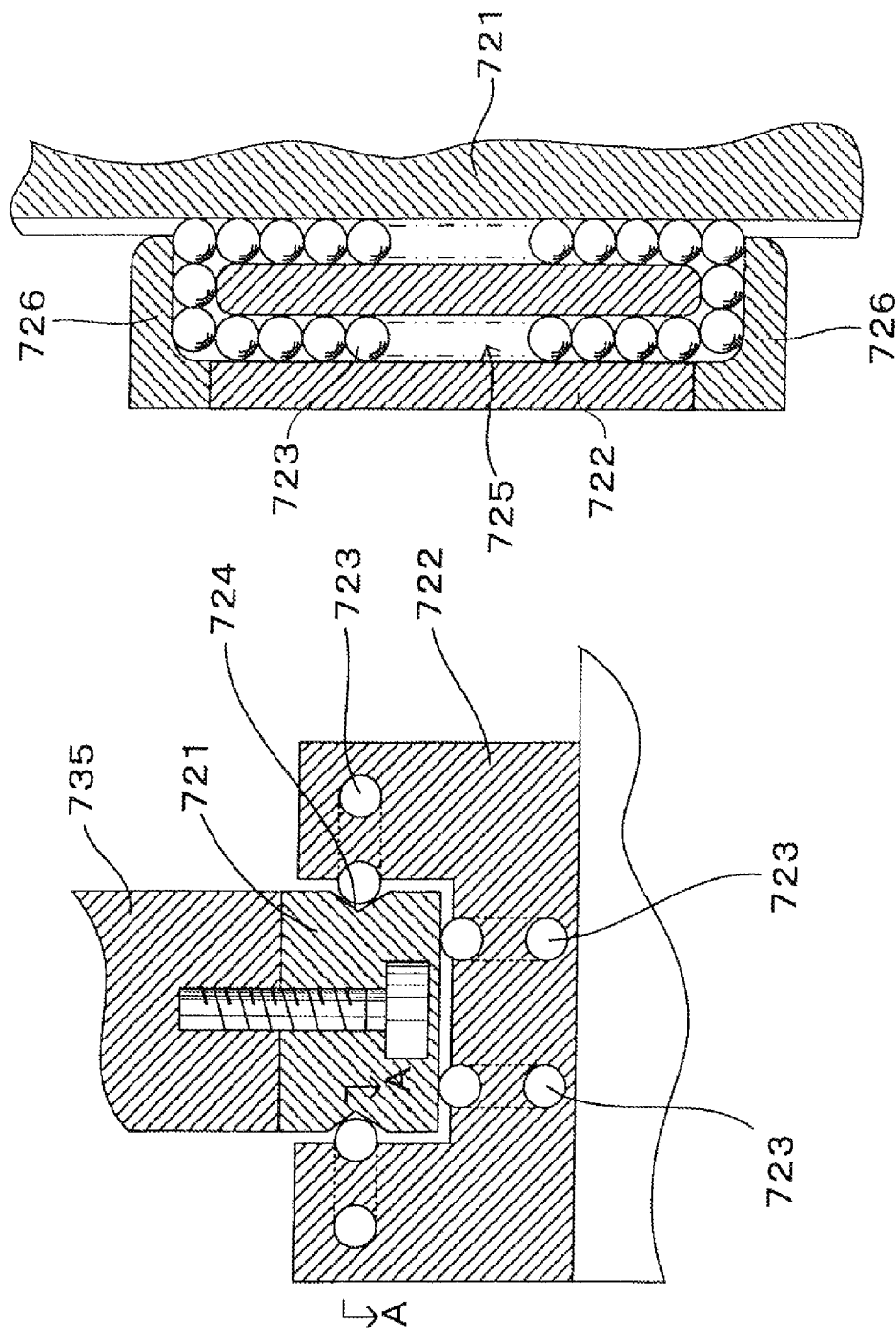

COMPONENT RECOGNIZING DEVICE, SURFACE MOUNTING MACHINE, AND COMPONENT TESTING MACHINE

TECHNICAL FIELD

The present invention relates to a component recognizing device that performs image recognition by taking an image of a held condition of a component held by a component holding member and to a surface mounting machine and a component testing machine each equipped with a component recognizing device.

BACKGROUND ART

As a device having a mechanism that handles components, such as electronic components, for example, many surface mounting machines and component testing machines have been proposed. In order to hold an electronic component, these machines are provided with a component holding member and it is possible to hold the component by sucking the top surface of the component at the lower end portion of the component holding member. Also, in order to transport a component from a component supply portion to a target position, the component holding member is incorporated into a head unit. In other words, the component holding member is moved to the target position by the head unit while it keeps holding the component. The positioning of the component at the target position is performed by releasing the component held by the component holding member at the target position. Hence, in order to increase the positioning accuracy, it is important to perform image recognition of a held condition of the component by the component holding member before the positioning so that the positioning of the component is performed by taking the held condition into account. In order to perform image recognition, the surface mounting machine and the component testing machine are equipped with a component recognizing device.

As such a component recognizing device, the one described, for example, in Japanese Patent No. 3186387 (paragraph [0017] and FIG. 3 and FIG. 4) has been known. According to this conventional device, a line sensor portion (corresponding to the scan unit of the invention) equipped with a line sensor is disposed below the component holding member so that an image of the bottom surface of a component can be taken by performing the scanning at the position directly below the component held by suction by the component holding member. A surface mounting machine equipped with this device is therefore able to enhance the positioning accuracy by performing image recognition of a held condition of the component according to the bottom surface image of the component.

Incidentally, the conventional device generally adopts a combination of a rotary motor (drive source), a ball screw shaft, and a ball and nut mechanism portion as a drive mechanism to drive the scan unit, such as the line sensor portion. In other words, a rotational drive force generated by the motor is converted to a linear drive force by the ball screw shaft and the ball and nut mechanism portion and the scan unit is driven using the linear drive force. This configuration raises a problem as follows in some cases.

As has been described, the component recognizing device takes an image of a component by moving the scan unit using the drive mechanism and the positioning of the component is performed according to the imaging result. Hence, in order to increase the positioning accuracy of the component, it is extremely important to position the scan unit at a high degree of accuracy and the drive mechanism is naturally required to have the positioning performance at a high degree of accuracy for the scan unit. However, the component recognizing device adopting the conventional drive mechanism has an error in the positioning accuracy of the scan unit in some cases because of wear of the ball screw shaft and the ball and nut mechanism portion.

As a countermeasure to solve the problems and issues as above, a linear motor may be employed as the drive source of the scan unit. The linear motor, however, drives an object to be driven (scan unit) using an interaction of magnetic fluxes generated by a stator and a mover while generating an attraction force between the stator and the mover. It is therefore necessary to apply the linear motor to the component recognizing device by taking the operating characteristics into account. More specifically, in a device adopting the linear motor, stress (attraction force) unique to the liner motor acts on guide means, such as a guide rail. Accordingly, in a case where the linear motor is improperly applied to the component recognizing device, excessively large stress may possibly be applied on the guide means and the components forming the guide means may wear out, which gives rise to rattling. Consequently, the position and the posture of the scan unit are changed and there is a possibility that image recognition of a component cannot be performed at a high degree of accuracy in a stable manner over a long term. In addition, in a case where a component recognizing device having poor stability and accuracy in image recognition as described above is incorporated into a surface mounting machine or a component testing machine, when the positioning of a component is performed according to the recognition result by the component recognizing device, the yield of the products is decreased and the inspection quality is deteriorated over a long term use.

The invention was devised in view of the foregoing and has a first object to perform the image recognition of a component at a high degree of accuracy in a stable manner over a long term with a component recognizing device configured to take an image of a component by moving the scan unit having imaging means.

Also, the invention has a second object to maintain a high mounting accuracy of a component on a substrate over a long term by increasing the image recognition accuracy of a component with a surface mounting machine equipped with a component recognizing device configured to take an image of a component by moving a scan unit having imaging means.

Further, the invention has a third object to maintain a component inspection accuracy over a long term by maintaining a high image recognition accuracy of a component over a long term with a component testing machine equipped with a component recognizing device configured to take an image of a component by moving a scan unit having imaging means.

DISCLOSURE OF THE INVENTION

The technical problems described above are solved by a component recognizing device or the like of the invention having the following configurations.

BRIEF DESCRIPTION OF THE DRAWINGS

FIG. 6 is a view showing the configuration of the linear guide.

BEST MODE FOR CARRYING OUT THE INVENTION

Figure 1:
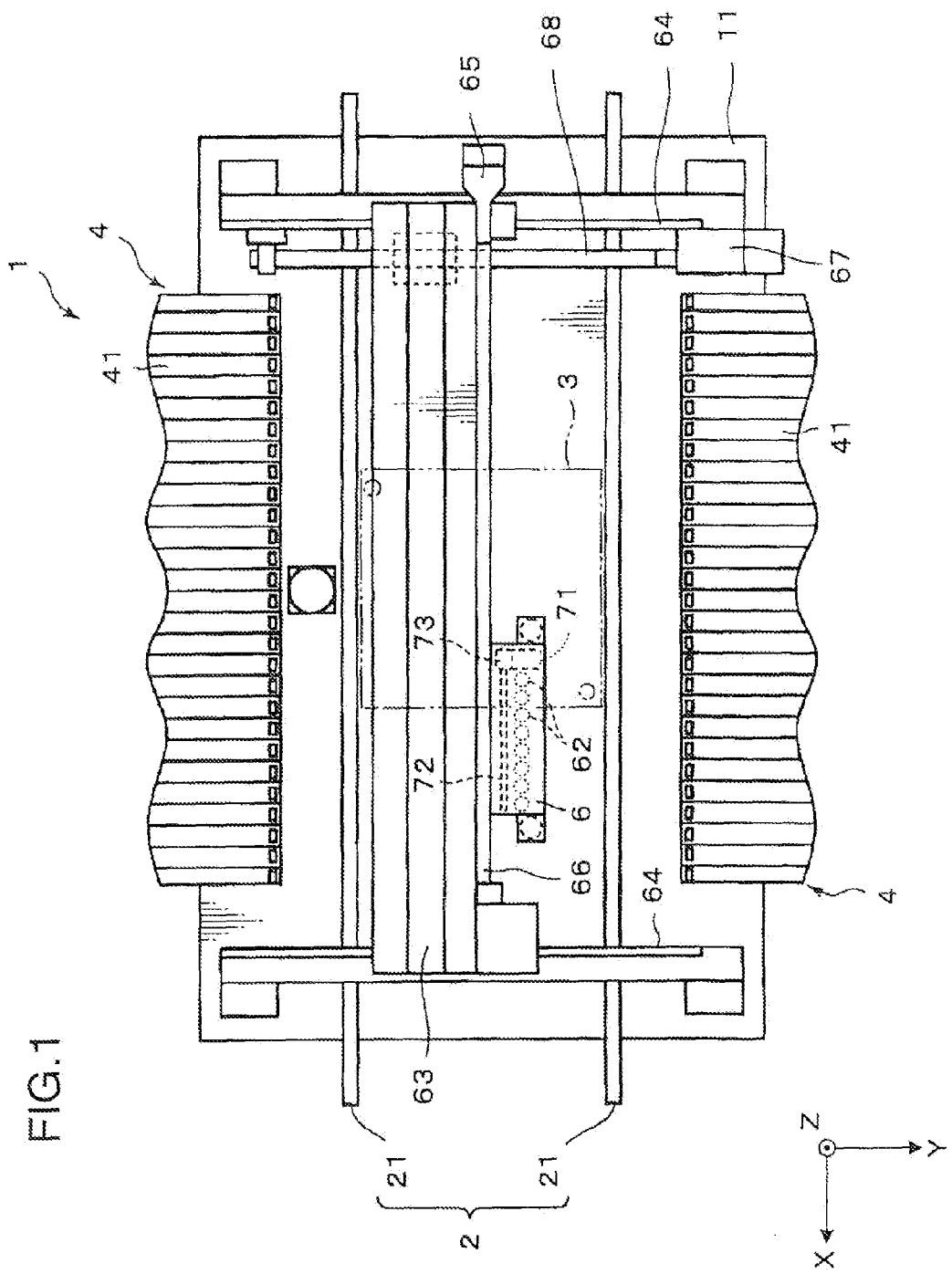
FIG. 1 is a plan view schematically showing the configuration of a surface mounting machine equipped with a first embodiment of a component recognizing device of the invention.
Figure 2:
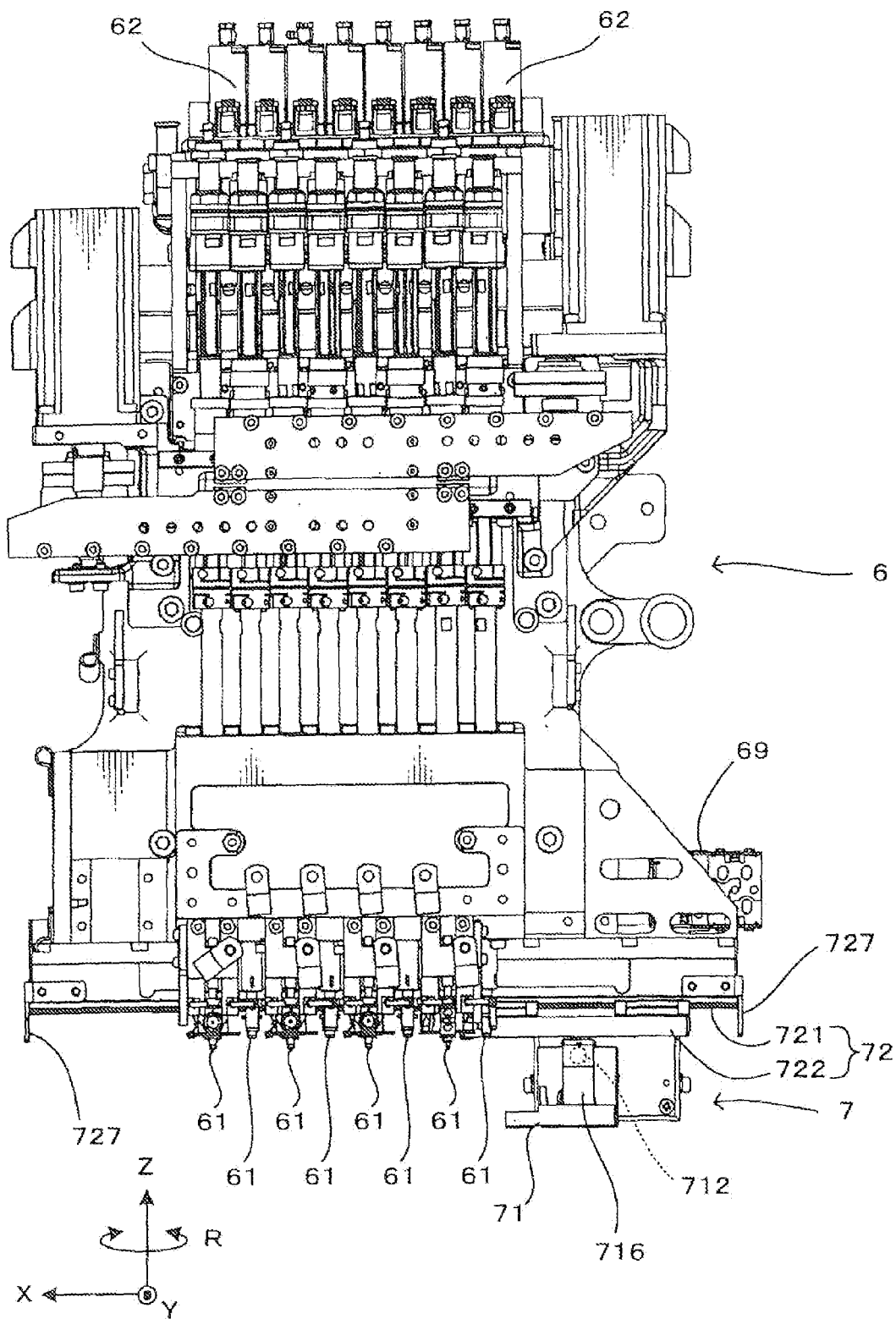
FIG. 2 is a front view of a head unit.
Figure 3:
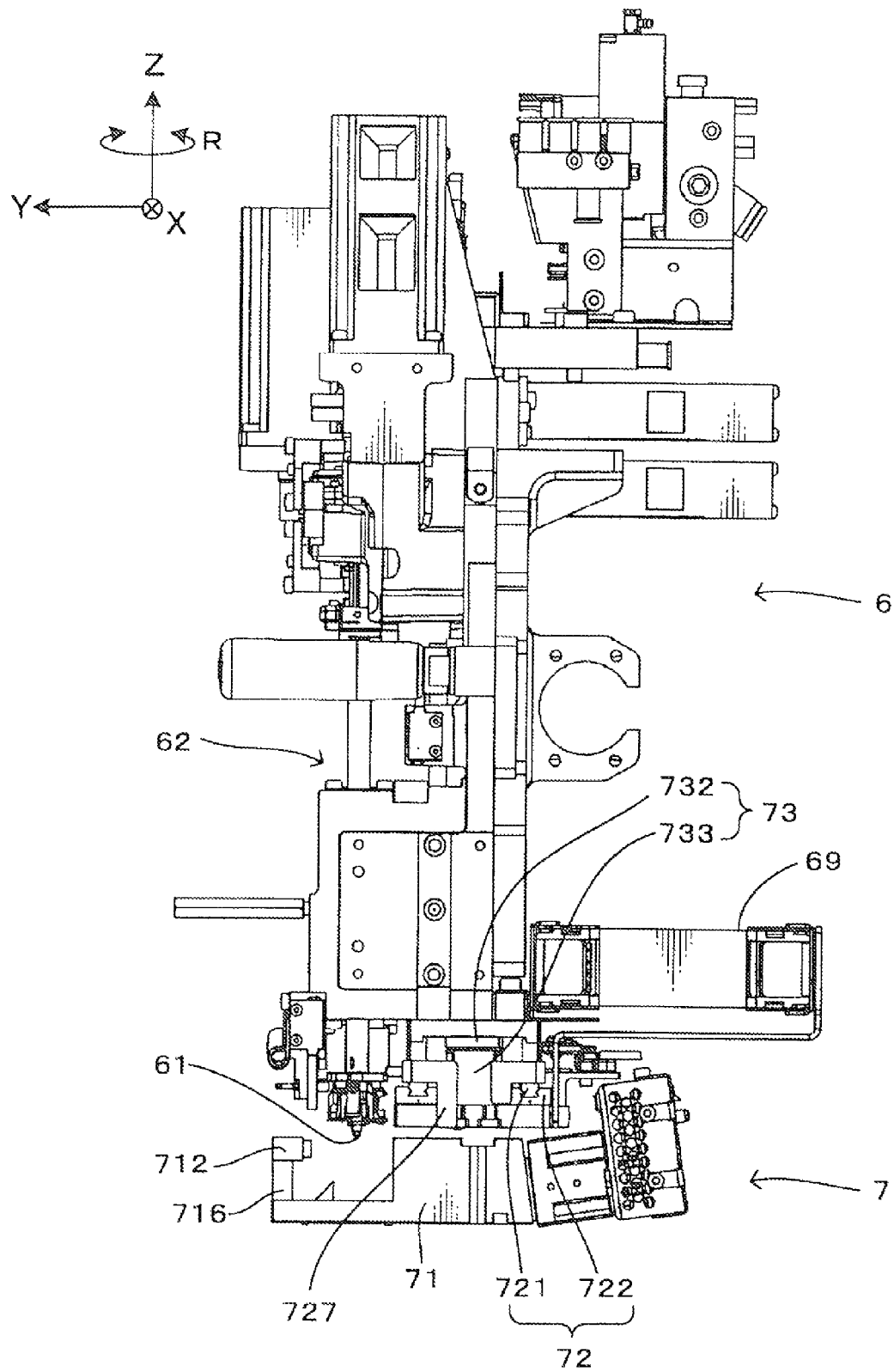
FIG. 3 is a side view of the head unit.

FIG. 1 is a plan view schematically showing the configuration of a surface mounting machine equipped with a first embodiment of a component recognizing device of the invention. FIG. 2 and FIG. 3 are a front view and a side view of a head unit, respectively. In each of these drawing and in some of drawings described below, the XYZ rectangular coordinate axes are shown for clarity of the directional relation.

Figure 5A:
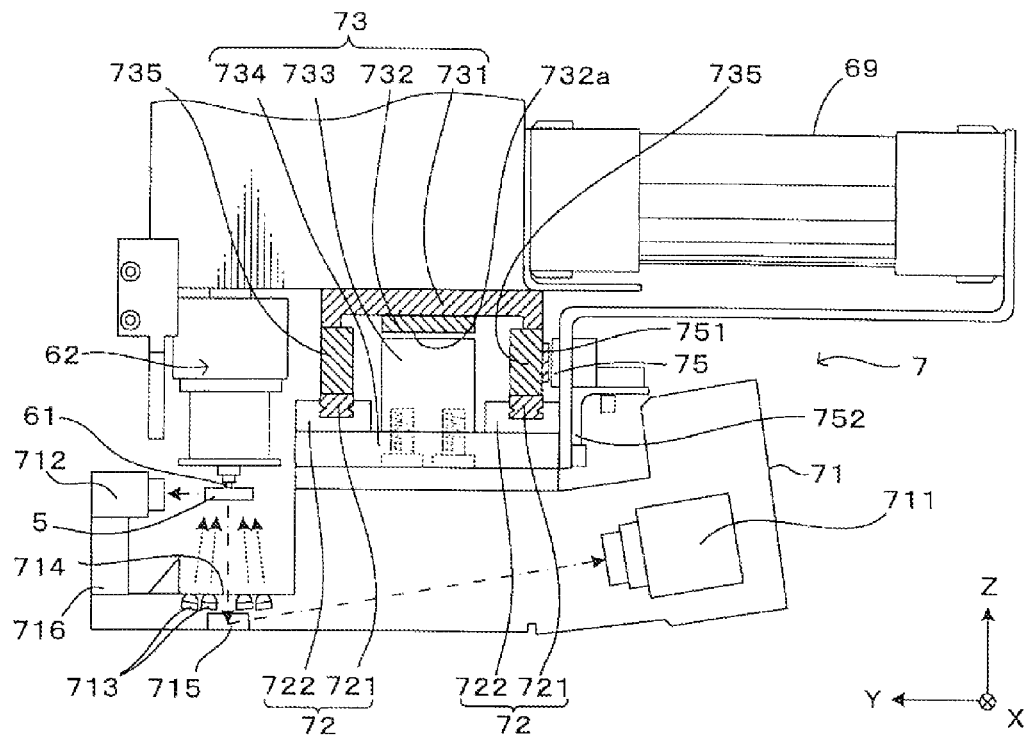
FIG. 5 is a view showing a partial cross section of the component recognizing device.

In a surface mounting machine 1, a substrate transportation mechanism 2 is disposed on a base stand 11 and it is possible to transport a substrate 3 in a predetermined transportation direction X. To be more specific, the substrate transportation mechanism 2 has a pair of conveyors 21 and 21 that transports the substrate 3 on the base stand 11 from right to left of FIG. 1. The conveyors 21 and 21 carry in the substrate 3 and stop substrate 3 at a predetermined mounting work position (the position of the substrate 3 shown in the drawing) to fix and hold the substrate 3 by an unillustrated holding device. Electronic components 5 (FIG. 5) supplied from component supply portions 4 are then placed on the substrate 3 by suction nozzles (component holding members) 61 incorporated into a head unit 6. In this instance, a component recognizing device 7 attached to the head unit 6 performs image recognition of a suction condition of the electronic components 5 by the suction nozzles 61 and outputs the recognition result to a control device 8 (FIG. 7) that controls the surface mounting machine 1 entirely. Meanwhile, the control device 8 mounts the electronic components 5 on the substrate 3 at predetermined positions by controlling a placing operation according to the image recognition result. The substrate transportation mechanism 2 carries out the substrate 3 when the mounting processing is completed for all the components to be mounted on the substrate 3.

The component supply portions 4 described above are disposed on the both sides of the substrate transportation mechanism 2 configured as above. The component supply portions 4 include a large number of tape feeders 41. Each tape feeder 41 is furnished with a reel (not shown) around which a tape accommodating and holding the electronic components 5 is wound and is thereby capable of supplying the head unit 6 with the electronic components 5. In other words, each tape accommodates and holds piece-wise chip electronic components 5, such as integrated circuits (IC's), transistors, and capacitors, at regular intervals. The electronic components 5 within the tapes are delivered intermittently while the tapes are unreeled from the tape feeders 41 toward the head unit 6. It thus becomes possible to pick up the electronic components 5 by the suction nozzles 61 of the head unit 6.

The head unit 6 not only transports the electronic components 5 to the substrate 3 while holding the electronic components 5 by suction by the suction nozzles 61, but also places the electronic components 5 at the positions specified by the user. It has a total of eight suction nozzles 61. To be more specific, the head unit 6 is configured as follows. In the head unit 6, eight mounting heads 62 each extending in a vertical direction Z are provided in line at equal intervals in an X axis direction (a transportation direction of the substrate 3 by the substrate transportation mechanism 2). The suction nozzle 61 is attached to the tip end portion of each mounting head 62. The head unit 6 therefore has a total of eight suction nozzles 61 disposed in line in the X direction. Each suction nozzle 61 is allowed to communicate with any one of a negative pressure generator, a positive pressure generator, and atmosphere via an electric switching valve (illustrations are omitted). By giving a negative-pressure suction force from the negative pressure generator to the suction nozzles 61 by the control device 8, the suction nozzles 61 become able to hold the electronic components 5 by sucking the top surfaces thereof at the lower end portions (tip end portions). Conversely, by supplying a positive pressure from the positive pressure generator to the suction nozzles 61 by the control device 8, the electronic components 5 are released from the holding by suction by the suction nozzles 61 and the electronic components 5 are mounted on the substrate 3 instantaneously by a positive pressure. The suction nozzles 61 are opened to atmosphere after the electronic components 5 are mounted. In this manner, the head unit 6 is able to suck and drop the electronic components 5 by controlling the negative-pressure suction force and a supply of the positive pressure by the control device 8.

Also, each suction nozzle 61 is allowed to move up and down (move in a Z axis direction) with respect to the head unit 6 by an unillustrated nozzle elevation drive mechanism and it is also allowed to rotate about the nozzle central axis (rotation in a direction indicated by a capital R in FIG. 2 and FIG. 3) by an unillustrated nozzle rotation drive mechanism. Of these drive mechanisms, the nozzle elevation drive mechanism moves up and down the suction nozzles 61 between a descent position at which sucking or mounting is performed and an ascent position at which transportation or imaging is performed. On the other hand, the nozzle rotation drive mechanism is a mechanism that rotates the suction nozzles 61 as needed and it is capable of locating the electronic components 5 in a predetermined R axis direction by rotational driving at the time of mounting. Each of these drive mechanisms is formed of a servo motor and a predetermined power transmission mechanism.

Further, in order to transport the electronic components 5 sucked by the suction nozzles 61 from the component supply portions 4 to the substrate 3 and mount the electronic components 5 on the substrate 3, the head unit 6 is allowed to move in the X axis direction and a Y axis direction (a direction orthogonal to the X axis and Z axis directions) within a predetermined range of the base stand 11. In other words, the head unit 6 is supported on a mounting head supporting member 63 extending in the X axis direction in a movable manner along the X axis. Also, the mounting head supporting member 63 is supported on fixed rails 64 in the Y axis direction at the both ends and is allowed to move in the Y axis direction along the fixed rails 64. The head unit 6 is driven in the X axis direction by an X axis servo motor 65 via a ball screw 66 and the mounting head supporting member 63 is driven in the Y axis direction by a Y axis servo motor 67 via a ball screw 68.

In this manner, the head unit 6 is capable of transporting the electronic components 5 sucked by the suction nozzles 61 from the component supply portions 4 to the target positions. According to this embodiment, in order to perform image recognition by successively taking images of the condition of being held by suction of the electronic components 5 by the suction nozzles 61 while the components are transported, the component recognizing device 7 is attached to the head unit 6. Hereinafter, the configuration and an operation of the component recognizing device 7 will be described.

Figure 4:
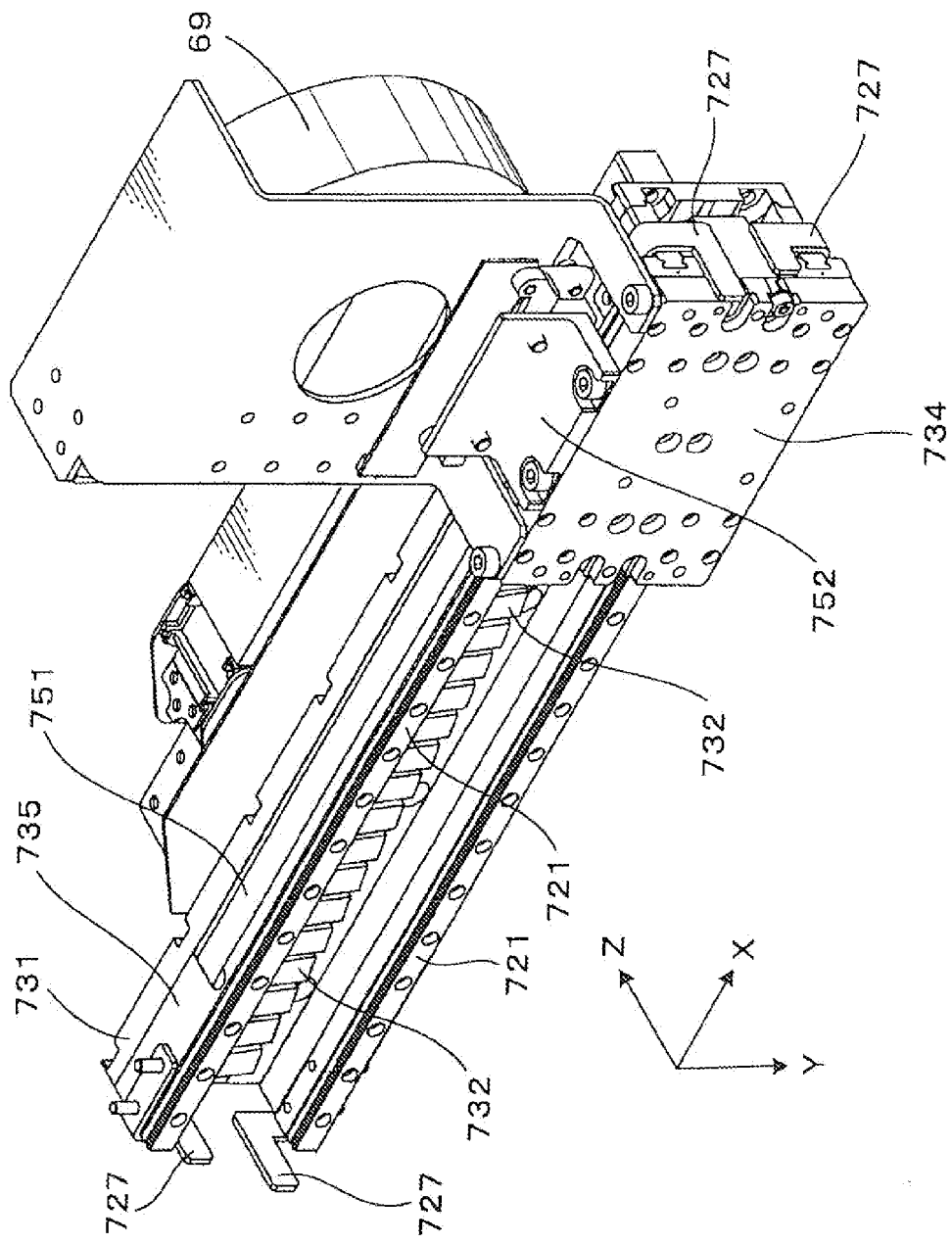
FIG. 4 is a perspective view showing the configuration of a linear motor and linear guides forming the component recognizing device.

FIG. 4 is a perspective view showing the configuration of a linear motor and linear guides forming the component recognizing device. FIG. 5 is view showing a partial cross section of the component recognizing device. Further, FIG. 6 is a view showing the configuration of each linear guide; FIG. 6A is a cross section of the linear guide and FIG. 6B is a cross section taken on line A-A of FIG. 6A. In the component recognizing device 7, a scan unit 71 is provided to the head unit 6 via both linear guides 72 and a linear motor 73. The scan unit 71 is supported on a pair of the linear guides 72 and 72 in a movable manner in the X axis direction and is also allowed to move in the X axis direction upon receipt of a drive force from the linear motor 73.

Regarding the linear motor 73, a stator is formed of a bottom frame 731 and permanent magnets 732 whereas a mover is formed of a coil portion 733 and a base plate 734. To be more specific, the configuration is as follows. The bottom frame 731 is of a shape extending in the X axis direction and fixed to the lower end portion of the head unit 6. As are shown in FIG. 4 and FIG. 5, a plurality of the permanent magnets 732 are disposed in one line in the X axis direction. In other words, the center portion of the bottom surface of the bottom frame 731 is a surface region that opposes the coil portion 733 of the mover. The permanent magnets 732 in a first polarity state (a state where the bottom surface is the south pole and the top surface is the north pole) and the permanent magnets 732 in a second polarity state (a state where the bottom surface is the north pole and the top surface is the south pole) are aligned alternately along the X axis direction in the surface region. As has been described, in this embodiment, the bottom surface 732a of the permanent magnet 732 corresponds to the surface opposing the mover of the invention and the stator of the linear motor 73 is provided to the head unit 6 in a state where the bottom surfaces 732a are faced downward, that is, oriented in the −Z direction.

In addition, side frames 735 having a shape extending in the X axis direction are fixed to the bottom surface of the bottom frame 731 on the both sides. Accordingly, a concave space surrounded by the bottom frame 731 and the side frames 735 is defined with its opening faced downward. The linear guides 72 are attached to the respective side frames 735 and the mover of the linear motor 73 is allowed to move within the concave space.

Each linear guide 72 is formed of a rail 721 (guide rail) extending in the X axis direction and a slider 722 attached to the rail 721 in a slidable manner in the X axis direction but in an immovable manner in the Y axis direction and the Z axis direction. The rails 721 and 721 in a pair are fixed to the lower end surfaces of the corresponding side frames 735 and they are disposed on the lower end portion of the head unit 6 side by side parallel to each other. Reference numerals 727 in FIG. 4 denote stoppers that limit the movements of the sliders 722. The linear guides 72 can adopt an arbitrary slide structure and in this embodiment, as is shown in FIG. 6, a slide bearing formed of steel balls 723 and the like are adopted. To be more concrete, the configuration is as follows.

As is shown in FIG. 6, slide grooves 724 extending in the X axis direction are formed in each rail 721 at portions in contact with the steel balls 723. A steel ball circulation path 725 extending in the X axis direction by penetrating through the slider 722 is provided in the vicinity of each groove 724 and guide members 726 that guide the respective steel balls 723 from the slide groove 724 to the steel ball circulation path 725 and from the steel ball circulation path 725 to the slide groove 724 are provided to the both end portions of the slider 722. The slide bearing is formed of a plurality of mechanical elements including the slide grooves 724, the steel ball circulation paths 725, the guide members 726, and a plurality of the steel balls 723 filled inside.

The mover of the linear motor 73 is fixed to a pair of the sliders 722 and 722 configured as above. In other words, the both end portions of the top surface of the base plate 734 are fixed to a pair of the sliders 722 and 722. Also, the coil portion 733 is fixed to the center portion of the top surface of the base plate 734 with fastening members, such as bolts. Accordingly, the base plate 734 and the coil portion 733 are integrally allowed to move in the X axis direction while being guided by the linear guides 72 with the coil portion 733 being present between a pair of the linear guides 72 and 72.

The coil portion 733 of the linear motor 73 configured as above is electrically connected to a linear drive control portion 86 (FIG. 7) via a motor drive cable (not shown). When a drive signal is given to the coil portion 733 from the linear drive control portion 86, the mover (the base plate 734 and the coil portion 733) starts to move in the X axis direction, in a direction and at a velocity corresponding to the drive signal. The scan unit 71 is thus driven in the X axis direction. Herein, a bendable duct member 69 is provided adjacently to the side surface of the head unit 6 and the motor drive cable is accommodated in the duct member 69 together with a sensor cable described next.

Figure 7:
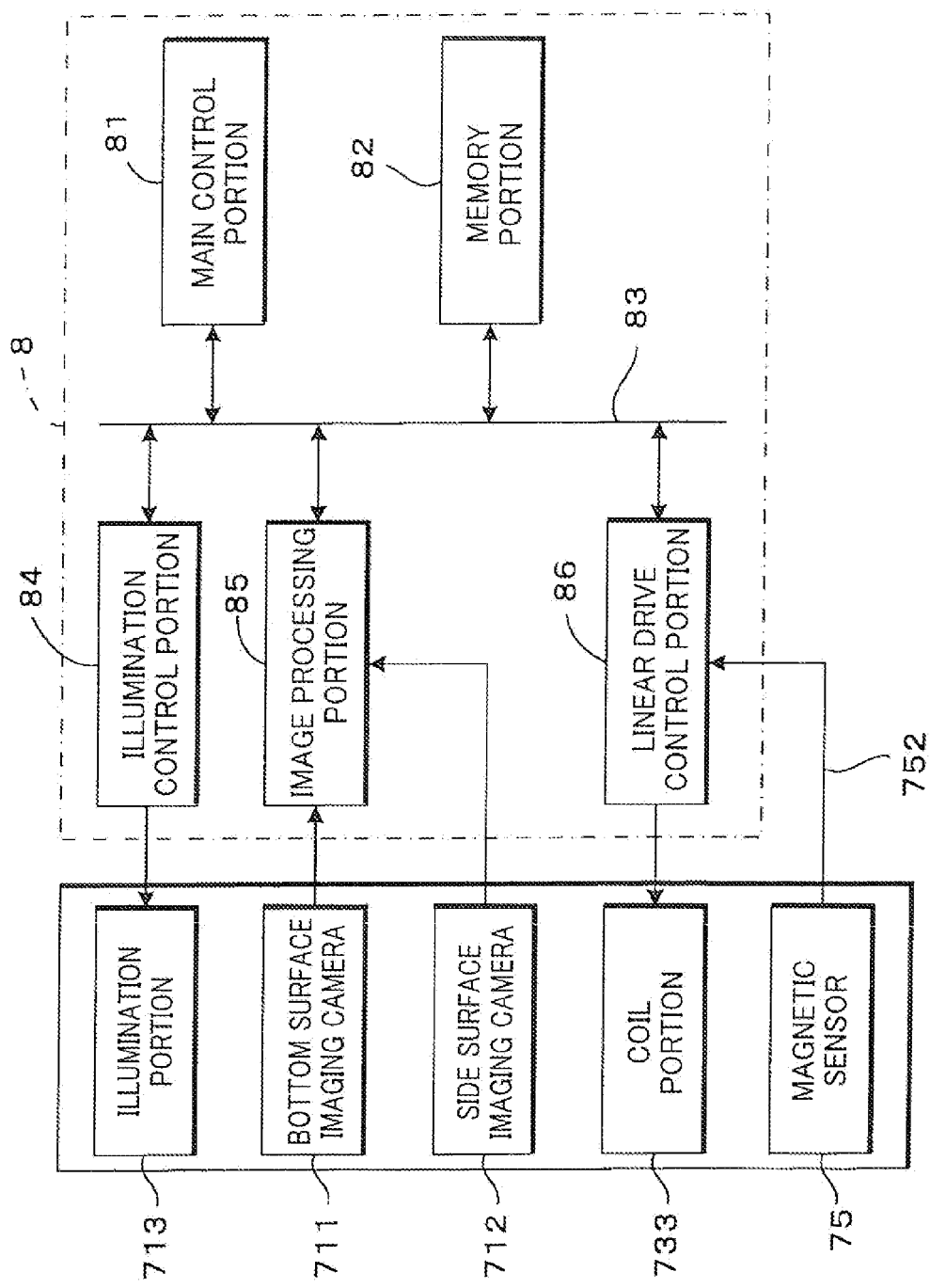
FIG. 7 is a block diagram partially showing the electrical configuration of a control device.

The sensor cable is a cable electrically connecting a sensor that detects the position of the scan unit 71 to the linear drive control portion 86. In this embodiment, a magnetic sensor 75 is used as the position detection sensor. More specifically, as is shown in FIG. 4, a plate-like magnetically graduated magnetic scale 751 is fixed to the side frame 735 on the side surface on the −Y side along one rail 721. Meanwhile, the magnetic sensor 75, such as an MR sensor and a Hall sensor, is attached to a sensor supporting member 752 fixed onto the side surface of the base plate 734. The magnetic scale 751 is read by the magnetic sensor 75. Accordingly, an electric signal relating to the position of the scan unit 71 in the X axis direction is outputted from the magnetic sensor 75 and given to the linear drive control portion 86 via the sensor cable 752 (FIG. 7). The position of the scan unit 71 is thus detected. It should be appreciated, however, that the position detection means of the scan unit 71 is not limited to a magnetic sensor and an arbitrary position detection method can be adopted.

The scan unit 71 driven in the X axis direction as described above is equipped with a bottom surface imaging camera 711 that takes an image of the bottom surface of the electronic component 5 and a side surface imaging camera 712 that takes an image of the side surface of the electronic component 5. It is configured in such a manner that both of the cameras 711 and 712 are either CCD area cameras or line sensors. Image recognition is performed by successively taking images of a sucked condition of the electronic components 5 by the suction nozzles 61 while the electronic components 5 sucked by the suction nozzles 61 are transported from the component supply portions 4 to the target positions by stopping the scan unit 71 or moving it at a very low velocity at the imaging position in the case of the CCD cameras and by maintaining a predetermined moving velocity in the case of the line sensors. In addition, the scan unit 71 has an illumination portion 713 that illuminates the suction nozzles 61 from below. Although the configuration and the installment position of the illumination portion 713 can be selected arbitrarily, the illumination portion 713 is formed of a plurality of light emitting diodes in this embodiment. The illumination portion 713 moves to the position directly below a given suction nozzle 61 in association with the movement of the scan unit 71 and selectively illuminates the electronic component 5 held by suction by this suction nozzle 61.

In this embodiment, the bottom surface imaging camera 711 formed of a line sensor is disposed inside the scan unit 71 and takes an image of the bottom surface of the electronic component 5 via an image capturing portion 714 (FIG. 5A) provided integrally with the scan unit 71. The image capturing portion 714 is provided to be surrounded by the light emitting diodes forming the illumination portion 713 when viewed in plane from above and is formed of a vertically long rectangular slit. By adopting the slit configuration in this manner, entrance of disturbance light into the camera 711 can be suppressed. It thus becomes possible to take an image of the bottom surface imaging area corresponding to a slit shape in a satisfactory manner. In addition, because the bottom surface imaging region is scanned in the X axis direction in association with the movement of the scan unit 71, the bottom surface image of the electronic component 5 sucked by the suction nozzle 61 can be taken precisely while the scan unit 71 passes under the suction nozzles 61. An image signal relating to the bottom surface image is then given to an image processing portion 85 (FIG. 7) of the control device 8. A numeral reference 715 in FIG. 5 denotes an optical path changing portion formed of an optical component, such as a reflection prism and a reflection mirror, provided inside the scan unit 71 and it is disposed at the position directly below the image capturing portion 714. The optical path changing portion 715 guides the light heading downward from the suction nozzle 61 to the camera 711.

The other camera 712 is fixed to the upper end portion of a camera supporting column 716. The camera supporting column 716 is provided to stand upright in the vertical direction (Z direction) on the top surface of the scan unit 71 at the end portion in the +Y direction and the height thereof is set correspondingly to a distance from the top surface to the tip ends of the suction nozzles 61. Accordingly, the height position of an area (side surface imaging region) that can be imaged by the side surface imaging camera 712 substantially coincides with the height position of the nozzle tip ends. It is therefore possible to take images of the side surfaces of both the tip end portion of the suction nozzle 61 and the electronic component 5 sucked by the suction nozzle 61 integrally. Also, as with the bottom surface imaging region, because the side surface imaging region is scanned in the X axis direction in association with the movement of the scan unit 71, an image of the side surface of the electronic component 5 sucked by the suction nozzle 61 can be taken precisely while the camera 712 provided to the scan unit 71 passes by the side of the suction nozzle 61. An image signal relating to the side surface image is then given to the image processing portion 85 (FIG. 7) of the control device 8.

Further, in this embodiment, the bottom surface imaging camera 711 and the side surface imaging camera 712 are provided to the scan unit 71 in such a manner that the bottom surface imaging region and the side surface imaging region substantially coincide with each other in the moving direction (X axis direction) of the scan unit 71. It thus becomes possible to take images of the bottom surface and the side surface of the electronic component 5 almost at the same time. In other words, not only the bottom surface image but also the side surface image of the electronic component 5 can be taken at a high degree of accuracy at a point in time when the scan unit 71 passes under the suction nozzle 61. This configuration is effective when both the camera 711 and 712 are formed of CCD area cameras. In this case, there is an advantage that the transportation time by the scan unit 71 is not extended because it is unnecessary to increase the stopping positions or the very low velocity moving positions for the imaging by the scan unit 71. In a case where both the cameras 711 and 712 are line sensors as in this embodiment, each of the bottom surface image and the side surface image can be taken at a high degree of accuracy without having to bring the bottom surface imaging region and the side surface imaging region into coincidence in the X axis direction. However, by bringing these regions into coincidence, the scan unit 71 can be formed compact in the X axis direction.

FIG. 7 is a block diagram partially showing the electrical configuration of the control device and it chiefly shows the configuration relating to image recognition. As is shown in the drawing, the control device 8 includes a main control portion 81 that systematically controls an overall operation of the surface mounting machine 1 and a memory portion 82 that pre-stores various processing programs and various types of data, and the former and the latter are connected to each other via a bus 83 to enable mutual signal reception and transmission. An illumination control portion 84, an image processing portion 85, and a linear drive control portion 86 are also connected to the bus 83. The main control portion 81 controls the illumination control portion 84, the image processing portion 85, and the linear drive control portion 86 according to the processing program pre-stored in the memory portion 82 and detects a held condition of the electronic component 5 and calculates an amount of suction displacement. Also, the main control portion 81 controls unillustrated control portions (a servo motor drive control portion, a negative pressure control portion, a positive pressure control portion, and so forth) that control the respective portions of the mounting machine, and mounts the electronic component 5 onto the substrate 3 while correcting the suction displacement. Herein, an example of image recognition of the held condition and the calculation of an amount of suction displacement will be described with reference to FIG. 8.

FIG. 8 is a schematic view showing an image recognition operation of a held condition and a correction operation of suction displacement in the first embodiment. FIG. 8A shows an example of the bottom surface image taken by the bottom surface imaging camera 711. FIG. 8B shows a component mount condition on the substrate. FIG. 8C shows an example of a side surface image taken in the case of normal suction. FIG. 8D shows an example of the side surface image taken in the case of poor suction.

In the surface mounting machine 1, as has been described, the control device 8 controls the respective portions according to the processing program pre-stored in the memory portion 82 while the electronic components 5 sucked by the suction nozzles 61 are transported from the component supply portions 4 to the target positions. Images of the electronic component 5 held by suction by each suction nozzle 61 are thus taken and a bottom surface image 91 shown in FIG. 8A and a side surface image 92 shown in FIG. 8C or FIG. 8D are obtained. The control device 8 then confirms suction displacement of the electronic component 5 with respect to the center of the suction nozzle 61 and the position of the electronic component 5 in the R axis direction according to the bottom surface image 91, and confirms absence or presence of poor suction according to the side surface image 92. Hereinafter, a drive control operation of the suction nozzle 61 according to the bottom surface image 91 and an absence/presence confirmation operation of poor suction according to the side surface image 92 will be described separately.

Figure 8A:
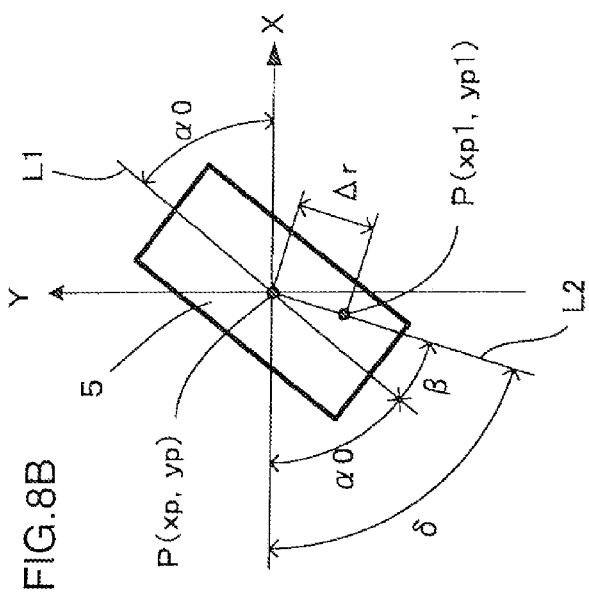
FIG. 8 is a schematic view showing an image recognition operation of a held condition of a component and a correction operation of suction displacement.

A point O in FIG. 8A indicates the center position of the suction nozzle 61 whereas a point O' indicates the center position of the electronic component 5 held by suction by the suction nozzle 61. In an ideal condition, both the points O and O' coincide with each other, and given this ideal state as a precondition, component mount position data on the substrate 3 is preliminarily provided to the control device 8. In this embodiment, the center position coordinate (xp, yp) of the electronic component 5 on the substrate 3 and a desired amount of rotation, α0, in the R axis direction are pre-stored in the memory portion 82 of the control device 8 as the mount position data.

Figure 8B:
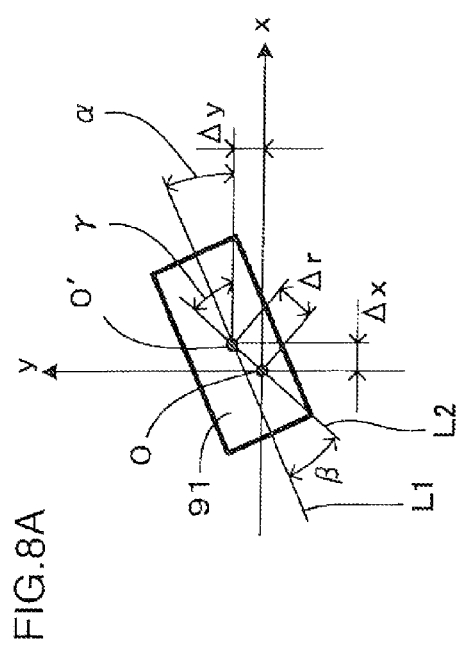
Figure 8C:
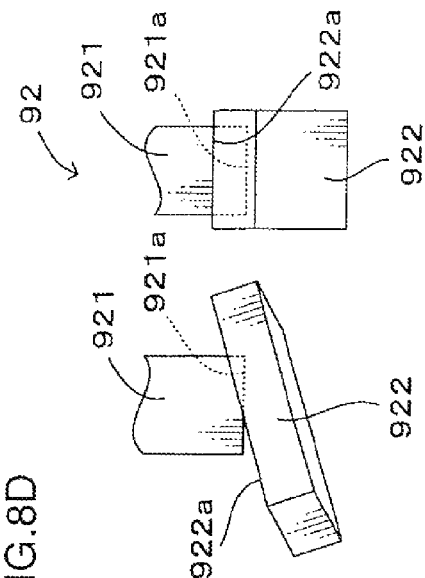
Figure 8D:
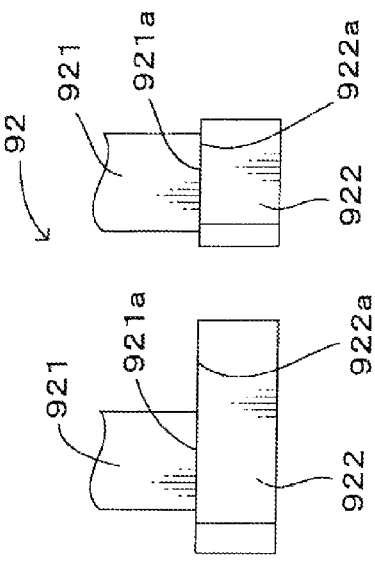

As is shown in FIG. 8A, in a case where the center portion O' of the electronic component 5 (hereinafter, referred to as the sucked component) held by suction by the suction nozzle 61 does not coincide with the center portion O of the suction nozzle 61, an amount of positional displacement, Δx, in the X axis direction and an amount of positional displacement, Δy, in the Y axis direction between the both points O and O' can be found by applying the image processing on the bottom surface image 91. Also, an amount of rotation, α, of the electronic component 5 can be found from the bottom surface image 91. By controlling the driving of the suction nozzle 61 according to these values, not only is it possible to bring the center position of the suction nozzle 61 onto the position coordinate P(xp1, yp1) on the substrate, but it is also possible to rotate the suction nozzle 61 by (α0−α) in the R axis direction. The positioning of the electronic component 5 on the substrate is thus performed as is shown in FIG. 8B. To be more concrete, the main control portion 81 of the control device 8 finds amounts of positional displacement, Δx and Δy, and an amount of rotation from the bottom surface image 91, and then finds a linear distance Δr between both the center positions O and O' by substituting the amounts of positional displacement caused by suction, Δx and Δy, into an equation below.

$$\Delta r = (\Delta x^2 + \Delta y^2)^{1/2} \quad \text{Equation (1)}$$

Herein, in the bottom surface image 91, given a straight line L1 as a virtual line passing through the center position O' of the electronic component 5 and extending in the longitudinal direction of the electronic component 5, a straight line L2 as a virtual line connecting both the center positions O and O', an angle α as an inclined angle (that is, an amount of rotation of the sucked component 5) of the straight line L1 with respect to the X axis direction, an angle β as an intersection angle of the two straight lines L1 and L2, and an angle γ as an inclined angle of the straight line L2 with respect to the X axis direction, then an equation as follows is established.

$$\gamma = \cos^{-1}(\Delta x/\Delta r) = \beta + \alpha \quad \text{Equation (2)}$$

We get an equation as follows by modifying Equation (2) above.

$$\beta = \cos^{-1}(\Delta x/\Delta r) - \alpha \quad \text{Equation (3)}$$

The control device 8 then finds the position coordinate P(xp1, yp1) from an angle δ, which is a sum of the angle α0 and the angle β, and the linear distance Δr.

$$xp1 = xp - \Delta r \cdot \cos \delta \quad \text{Equation (4)}$$

$$yp1 = yp - \Delta r \cdot \sin \delta \quad \text{Equation (5)}$$

where $\delta = \alpha 0 + \beta = (\alpha 0 - \alpha) + \cos^{-1}(\Delta x/\Delta r)$.

As will be described below, the control device 8 performs the positioning of the electronic component 5 in such a manner that the center position of the electronic component 5 perfectly coincides with the center position coordinate (xp, yp) on the substrate as is shown in FIG. 8B by driving the suction nozzle 61 under its control. Also, the control device 8 rotates the suction nozzle 61 by an angle (α0−α) in the R axis direction. Owing to these operations, even when suction displacement occurs, it becomes possible to mount the electronic component 5 on the substrate 3 at desired position and angle of rotation.

The absence/presence confirmation operation of poor suction according to the side surface image 92 will now be described with reference to FIG. 8C and FIG. 8D. In this embodiment, because the side surface imaging camera 712 takes images of the side surface of both the tip end portion of the suction nozzle 61 and the electronic component 5 sucked by the suction nozzle 61 integrally, the side surface image 92 includes a suction nozzle image 921 and a sucked component image 922. In a case where the suction is performed normally, as is shown in FIG. 8C, the tip end 921a of the suction nozzle image 921 coincides with the upper end 922a of the sucked component image 922. On the contrary, as is shown in FIG. 8D, in a case where the tip end 921a of the suction nozzle image 921 does not coincide with the upper end 922a of the sucked component image 922, an inclination of the sucked component 5 with respect to the suction nozzle 61 can be detected, from which poor suction can be determined. As is indicated by a dotted line in FIG. 8D, even in a case where the tip end 921a of the suction nozzle image 921 is not clearly shown in the side surface image 92, the control device 8 is able to find the tip end 921a from computation.

In a case where satisfactory suction is determined, the control device 8 mounts the electronic component 5 on the substrate 3 by the drive control described above. In other words, the control device 8 brings the center position of the electronic component 5 into coincidence perfectly with the center position coordinate (xp, yp) on the substrate 3 by driving the X axis servo motor 65 and the Y axis servo motor 67 of the head unit 6 under its control. Also, the control device 8 rotates the suction nozzle 61 by an angle (α0−α) in the R axis direction by driving an unillustrated nozzle rotation drive mechanism under its control.

Meanwhile, in a case where poor suction is determined, the control device 8 discards or collects the electronic component 5 according to the size. More specifically, for a small and relatively inexpensive component 5, the suction nozzle 61 is transported to an unillustrated waste box while the components 5 is kept sucked and discards the component 5 into the waste box. On the other hand, for a large and relatively expensive component 5, the suction nozzle 61 is transported to an unillustrated collection box while the component 5 is kept sucked and drops the component 5 into the collection box so that it is collected for reuse.

In this embodiment, whether the suction is satisfactory or poor is determined according to the side surface image 92. It should be appreciated, however, that the determination may be made according to the bottom surface image 91. In other words, the control device 8 is able to detect a condition where the center position O of the suction nozzle 61 is away from the center position O' of the sucked component 5 by a predetermined distance or more according to the bottom surface image 91. For example, the control device 8 substitutes actual measurement values (amounts of positional displacement, Δx and $\Delta y$, and an amount of rotation, $\alpha$) from the bottom surface image 91 into two inequalities below and determines poor suction when at least one inequality is established.

$$\Delta r \cdot \cos \beta > \text{predetermined value} \quad \text{Equation (6)}$$

$$\Delta r \cdot \sin \beta > \text{predetermined value} \quad \text{Equation (7)}$$

In such a case, poor suction is determined and the component 5 can be discarded or collected in the same manner as in this embodiment.

As has been described, according to the component recognizing device 7 of this embodiment, it is configured in such a manner that the scan unit 71 is driven by combining the linear guides 72 and the linear motor 73. Hence, in comparison with a component recognizing device (for example, the device described in Japanese Patent No. 3186387) employing a drive device formed of a ball screw shaft, a ball nut fit to the shaft, and a typical rotary motor that drives either the shaft or the nut to rotate in combination with a portion corresponding to the linear guides 72 described above, the component recognizing device 7 is excellent in silence, maintenance, and high velocity because it eliminates noises generated by the ball screw shaft and the ball nut mechanism portion, the need of maintenance, the limitation on a moving velocity, and so forth. Moreover, the permanent magnets 732 and the coil portion 733 forming the linear motor 73 have a specific installment relation. It thus becomes possible to lower stress given to the linear guides 72. The operational advantage in this regard will be described in detail with reference to FIG. 5B.

As with this embodiment, it is possible to use a linear motor that drives an object using an interaction between magnetic fluxes generated by the permanent magnets and the coil portion while generating an attraction force between the former and the latter as the drive source. However, when the attraction force is directly applied to the guide unit, such as linear guides, an influence of the attraction force is given directly to the guide unit, which may possibly give rise to wear of the guide unit. For example, the most concerned in this embodiment is the wear of the steel balls 723.

Figure 5B:
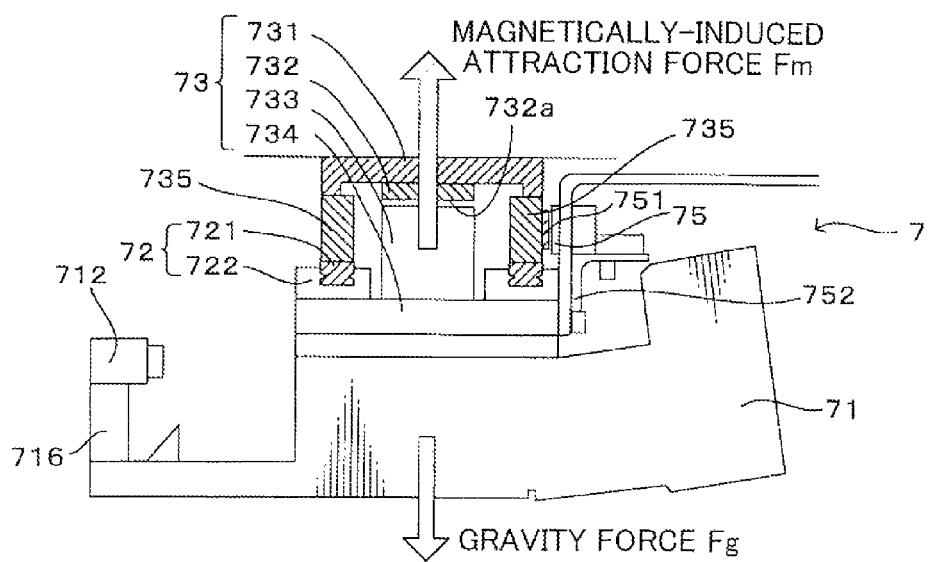

By contrast, as is shown in FIG. 5B, in this embodiment, the linear motor 73 is fixed to the head unit 6 in a state where the surfaces 732a of the permanent magnets 732 opposing the coil portion 733, that is, the surfaces subject to the action of the magnetic flux from the coil portion 733 most significantly, are faced downward. The coil portion 733 is disposed at the position directly below the permanent magnets 732. Hence, an attraction force Fm induced between the coil portion 733 and the permanent magnets 732 acts on the linear guides 72 in an upward direction (+Z direction) via the bottom frame 731. Meanwhile, the coil portion 733 is allowed to move integrally with the base plate 734 in the X axis direction and the scan unit 71 is attached to the base plate 734 in a hanging state. Accordingly, own weights (gravity force) Fg of the scan unit 71 and the cameras 711 and 712 attached to the unit 71 or the like act on the linear guides 72 in a downward direction (−Z direction) via the base plate 734. Hence, in this embodiment, it is possible to ease the influence of the attraction force Fm applied on the linear guides 72 correspondingly to the own weights Fg. Wear of the linear guides 72 can be therefore suppressed effectively. Consequently, no rattling occurs between the rails 721 and the sliders 722 in the Y axis direction and in the Z axis direction, and the position and the posture of the both cameras 711 and 712 and further those of the optical path changing portion 715 with respect to the suction nozzle 61 and the electronic component 5 remain the same. It thus becomes possible to perform image recognition of the tip end portions of the suction nozzles 61 and the electronic components 5 at a high degree of accuracy in a stable manner over a long term.

Also, in this embodiment, an image of the bottom surface of the electronic component 5 is taken and the positional displacement and the orientation in the R axis direction (an amount of rotation, $\alpha$) of the electronic component 5 with respect to the suction nozzle 61 can be found according to the bottom surface image as a held condition of the component. As has been described above, the control device 8 controls the driving of the suction nozzle 61 by taking the positional displacement and the orientation in the R axis direction into account and is thereby able to mount the electronic component 5 on the substrate 3 at desired position and angle of rotation. Hence, according to the surface mounting machine 1 of this embodiment, it is possible to mount the electronic component 5 on the substrate 3 at a high degree of accuracy.

Figure 9:
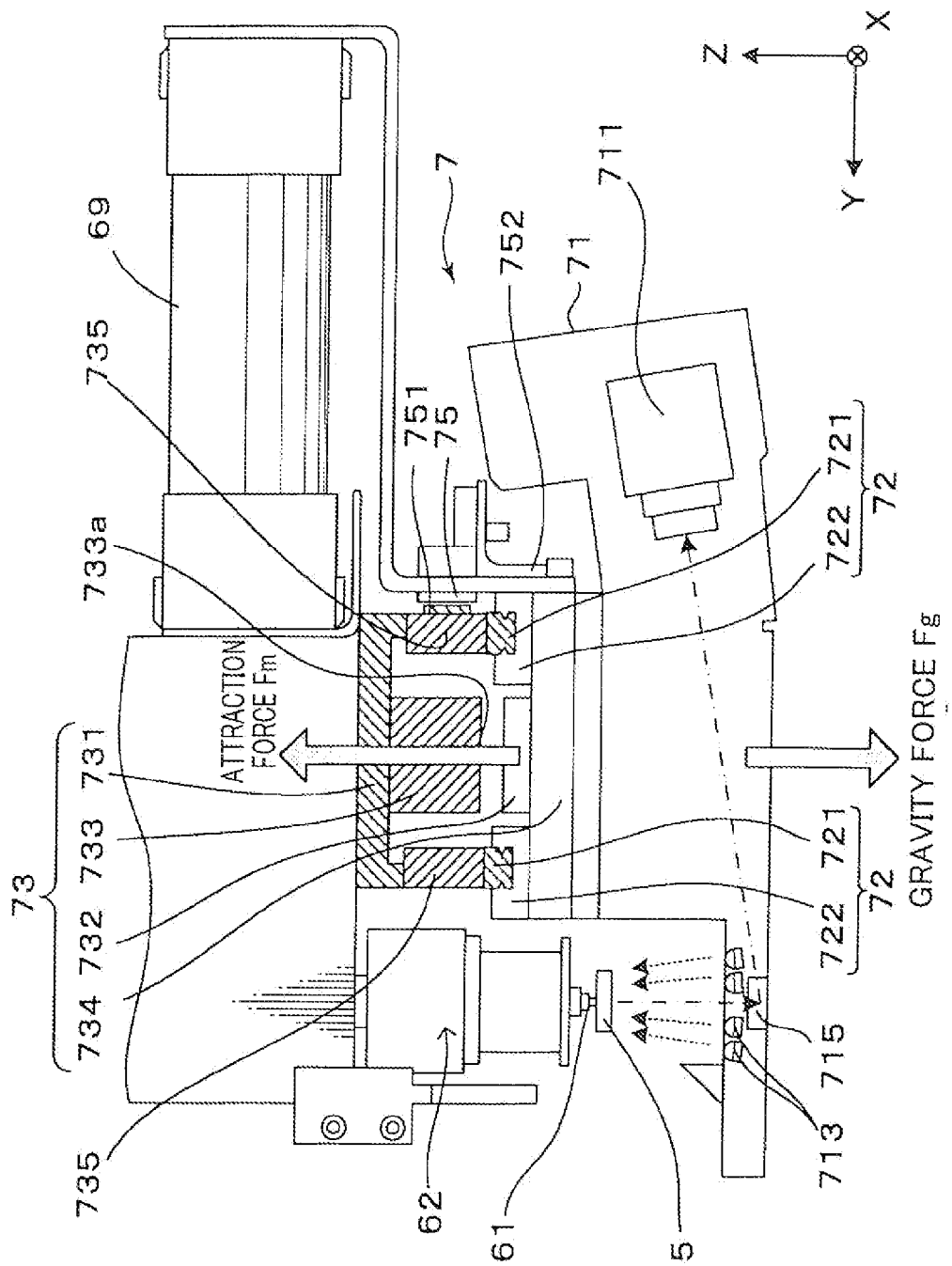
FIG. 9 is a partial cross section showing a second embodiment of the component recognizing device of the invention.

FIG. 9 is a partial cross section showing a second embodiment of the component recognizing device of the invention. The second embodiment is noticeably different from the first embodiment above in two points that the permanent magnets 732 and the coil portion 733 are in a reversed installment relation and that the bottom surface imaging camera 711 alone is provided as the imaging device. The other configurations are basically the same as those of the first embodiment above. Hence, hereinafter, descriptions will be given chiefly to the differences.

In the second embodiment, a linear motor 73 of a so-called moving magnet method is employed as the drive source. In other words, as is shown in the drawing, the permanent magnets 732 are fixed on the base plate 734 and allowed to move in the X axis direction integrally with the base plate 734. Meanwhile, the center portion of the bottom surface of the bottom frame 731 is a surface region opposing the permanent magnets 732 moving in the X axis direction and a plurality of coil portions 733 are fixedly arrayed in the surface region in the X axis direction. The mover (base plate 734 and permanent magnets 732) are driven in the X axis direction as the linear drive control portion 86 controls the respective coil portions 733. In this manner, in this embodiment, the bottom surface 733a of each coil portion 733 corresponds to the surface opposing the mover of the invention and the linear motor 73 is provided to the head unit 6 in a state where the bottom surfaces 733a are faced downward. Hence, as with the first embodiment above, the attraction force Fm inducted between the coil portions 733 and the permanent magnets 732 acts on the linear guides 72 in an upward direction (+Z direction) via the bottom frame 731. Meanwhile, own weights (gravity force) Fg of the scan unit 71 and the camera 711 or the like attached to the unit 71 act on the linear guides 72 in a downward direction (−Z direction) via the base plate 734. Hence, the same operational advantage as the first embodiment above can be achieved, that is, it becomes possible to suppress wear of the linear guides 72 effectively. Consequently, no rattling occurs between the rails 721 and the sliders 722 in the Y axis direction and in the Z axis direction, and the position and the posture of the both cameras 711 and 712 and further those of the optical path changing portion 715 with respect to the suction nozzle 61 and the electronic component 5 remain the same. It thus becomes possible to perform image recognition of the tip end portions of the suction nozzles 61 and the electronic components 5 at a high degree of accuracy in a stable manner over a long term.

Figure 10A:
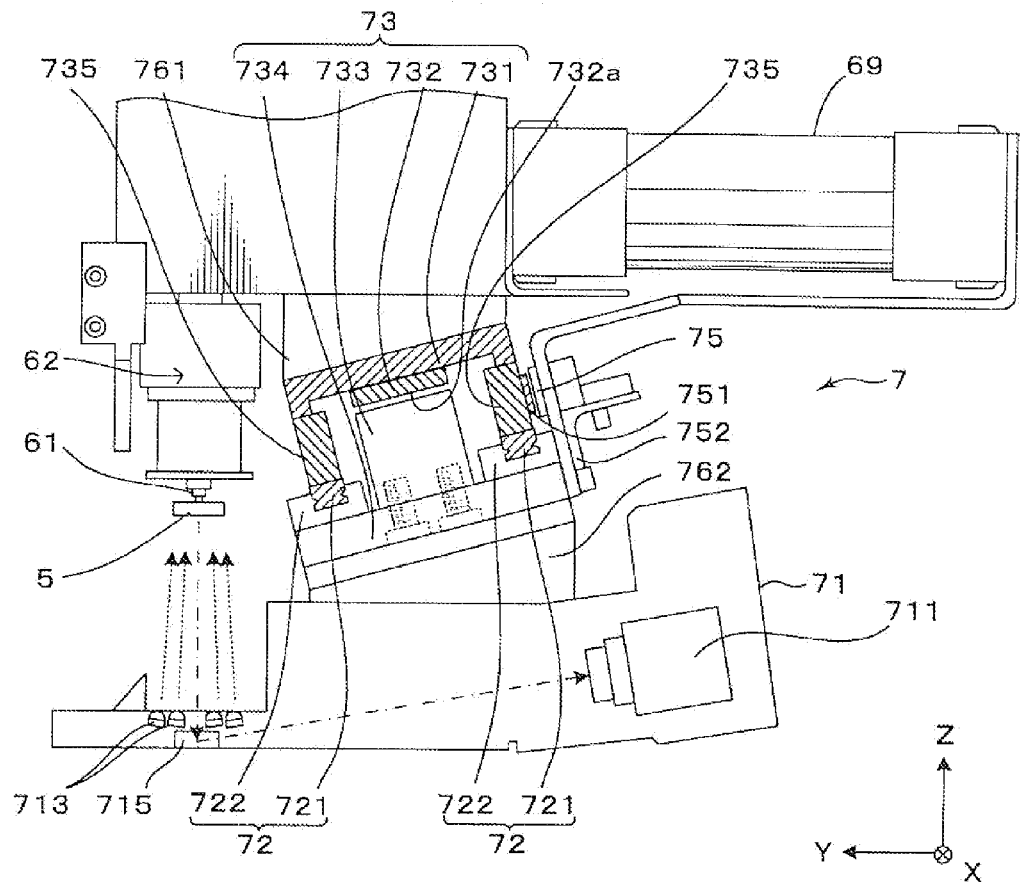
FIG. 10 is a partial cross section showing a third embodiment of the component recognizing device of the invention.

FIG. 10 is a partial cross section showing a third embodiment of the component recognizing device of the invention. The third embodiment is noticeably different from the first embodiment above in two points that the linear guides 72 and the linear motor 73 are disposed with inclination and the bottom surface imaging camera 711 alone is provided as the imaging device. The other configurations are basically the same as those of the first embodiment above. Hence, hereinafter, descriptions will be given chiefly to the differences.

In the third embodiment, as is shown in the drawing, the bottom frame 731 is fixed to the lower end portion of the head unit 6 via an upper block member 761 while the scan unit 71 is fixed to the base plate 734 of the linear motor 73 via a lower block member 762. The bottom surface of the upper block member 761 is inclined by an angle θ in a counterclockwise direction on the sheet surface of the drawing, and the top surface of the lower block member 762 is inclined by an angle θ in a clockwise direction on the sheet surface. Accordingly, the linear guides 72 and the linear motor 73 are disposed in a state where each is inclined only by an angle θ in a clockwise direction. It thus becomes possible to suppress the influence of the attraction force Fm applied on the linear guides 72. The reason is as follows.

Figure 10B:
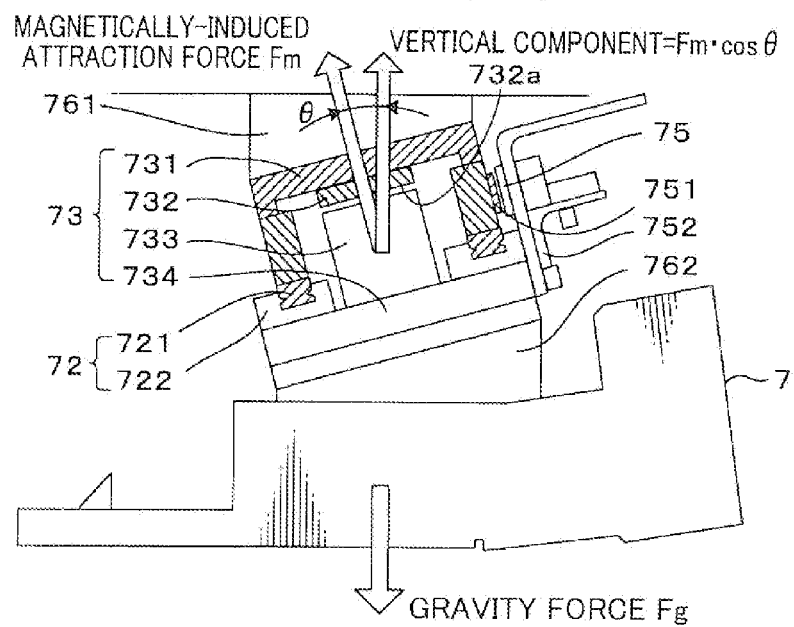

In a case where the installment and the structure as above are adopted, as is shown in FIG. 10B, the linear motor 73 is fixed to the head unit 6 in a state where the surfaces 732a of the permanent magnets 732 opposing the coil portion 733, that is, the surfaces subject to the action of the magnetic flux from the coil portion 733 most significantly, are diagonally faced downward. The coil portion 733 is disposed oppositely to the surfaces 732a. It thus becomes possible to further ease the influence of the attraction force applied on the linear guides 72 in comparison with the downward installment (first embodiment) as described above. This is because the attraction force Fm induced between the coil portion 733 and the permanent magnets 732 acts in a direction inclined by an angle θ with respect to the vertical direction Z owing to the inclination of the opposing surface 733a, and the vertical component of the attraction force becomes (Fm·cos θ), which is smaller than the attraction force Fm.

According to the third embodiment, it is possible to adjust the influence of the attraction force applied on the linear guides 72 with the angle of inclination, θ. Hence, by setting the angle of inclination, θ, according to the respective components forming the component recognizing device 7, the influence of the attraction force can be optimized. It thus becomes possible to increase the degree of freedom in design of the component recognizing device 7.

It should be appreciated that the invention is not limited to the embodiments described above and the embodiments described above can be modified in various manners without deviating from the scope of the invention. For example, in the first embodiment, the bottom surface imaging camera (bottom surface imaging portion) 711 and the side surface imaging camera (side surface imaging portion) 712 are provided as the imaging device. However, as with the second embodiment and the third embodiment, it may be configured in such a manner that the bottom surface imaging camera (bottom surface imaging portion) 711 alone is provided so as to perform image recognition of a held condition of the electronic component 5 according to the bottom surface image alone. Conversely, it may be configured in such a manner that the side surface imaging camera (side surface imaging portion) 712 is further provided as the imaging device in the second embodiment and the third embodiment as in the first embodiment so as to perform image recognition of a held condition of the electronic component 5 according to the bottom surface image and the side surface image.

Also, in the first embodiment, the bottom surface image and the side surface image are taken at the same time. However, the imaging timing of the bottom surface image by the bottom surface imaging camera 711 and the imaging timing of the side surface image by the side surface imaging camera 712 may differ from each other. Also, the cameras 711 and 712 are not necessarily formed of line sensors and they may be formed of area sensors. When combined appropriately, it becomes possible to achieve the operational advantage described above. In other words, in a case where CCD area cameras are adopted, images of the electronic components 5 can be taken at a time after the scan unit 71 is moved to the predetermined position and the positioning is completed. It is therefore possible to apply image processing for a plurality of the electronic components 5 at a time and the image processing time can be shortened. In the case of line sensors, by configuring in such a manner that the bottom surface image and the side surface image are taken at the same time by bringing the bottom surface imaging region and the side surface imaging region into coincidence in the X axis direction, the scan unit 71 can be formed compact in the X axis direction.

In the embodiments above, the bottom surface imaging camera 711 takes an image of the electronic component 5 in the vertical direction Z. The imaging direction, however, is not limited to this particular direction and can be changed as needed according to the installment relation with a peripheral device.

In the embodiments above, the scan unit 71 is guided in the X axis direction by using the two linear guides 72. The number of the linear guides 72, however, is not limited to two. For example, it may be configured in such a manner that the scan unit 71 is guided by the single linear guide 72.

Also, the configurations of the substrate transportation mechanism 2, the mounting head 62, and the head unit 6 adopted in the embodiments above are not intended to limit the invention and various design modifications are possible. A tray feeder or a wafer feeder may be used as the component supply portions 4. Alternatively, a combination of these feeders including the tape feeders 41 may be used as well.

In the embodiments above, the invention is applied to the surface mounting machine 1 in which eight suction nozzles 61 are disposed in one line. The number and the alignment manner of the suction nozzles are not limited to those described above. For example, the component recognizing device 7 may be equipped to the surface mounting machine 1 in which one suction nozzle 61 is incorporated into the head unit 6.

Also, applications of the invention are not limited to the surface mounting machine. The invention is also applicable to a component testing machine including a head unit that incorporates a component holding member capable of holding a component and transporting the component holding member between a component supply portion and a component inspection portion. The component testing machine holds and carries out a component from the component supply portion using the component holding member and performs image recognition of a held condition of the component by taking an image of the component held by the component holding member. The component is released from suction above a collection box in a case where the held condition is not acceptable so that the component is collected into the collection box, whereas the component is placed on the component inspection portion after the positions in both the X and Y directions are corrected and the R direction is adjusted in a case where the held condition is acceptable so that the component inspection is performed.

It goes without saying that the various design modifications are possible within the scope of the appended claims of the invention.

In the last place, features and advantages of the invention disclosed based on the above embodiments will be summarized as follows.

The invention provides a component recognizing device provided to a head unit incorporating a component holding member capable of holding a component and configured to perform image recognition by taking an image of a held condition of the component by the component holding member. In order to achieve the first object, the component recognizing device is characterized by including: a guide unit having a guide rail provided to the head unit to extend in a predetermined moving direction and a slider allowed to slide in the moving direction along the guide rail while a movement in a direction orthogonal to the moving direction is limited; a scan unit having an imaging device for taking an image of the component held by the component holding member and allowed to move in the moving direction with respect to the head unit by the guide unit; and a linear motor driving the scan unit in the moving direction by an interaction of magnetic fluxes generated by a stator and a mover while generating an attraction force between the stator and the mover, wherein the slider and the scan unit are attached to the mover, and the stator is fixed to the head unit in a state where a surface opposing the mover is faced downward or diagonally downward.

According to the component recognizing device configured as above, the slider and the scan unit are attached to the mover of the linear motor and the stator of the linear motor is fixed to the head unit in a state where a surface opposing the mover is faced downward or diagonally downward. It thus becomes possible to ease the influence of an attraction force applied on the guide unit and wear of the guide unit can be suppressed effectively. Consequently, it becomes possible to prevent the occurrence of rattling between the guide rail and the slider in a direction orthogonal to the moving direction. The image recognition of a component can be therefore performed at a high degree of accuracy in a stable manner over a long term.

In order to perform the image recognition by taking an image of the held condition of the component, a bottom surface imaging portion that takes an image of a bottom surface of the component may be used as the imaging device. More specifically, it may be configured in such a manner that a bottom surface imaging region that can be imaged by the bottom surface imaging portion moves to the bottom surface of the component held by the component holding member as the imaging device moves in the moving direction in association with a movement of the scan unit, so that the bottom surface imaging portion takes a bottom surface image of the component. Accordingly, the bottom surface image of the component can be taken at a high degree of accuracy.

Also, a side surface imaging portion that takes an image of a side surface of the component may be added as the imaging device. More specifically, it may be configured in such a manner that a side surface imaging region that can be imaged by the side surface imaging portion moves to a side surface of the component held by the component holding member as the imaging device moves in the moving direction in association with a movement of the scan unit, so that the side surface imaging portion takes a side surface image of the component. Accordingly, the side surface image of the component can be taken at a high degree of accuracy. By taking images of the component not only from the bottom surface but also from the side surface in this manner, it becomes possible to understand the held condition of the component more precisely.

A relative relation of the bottom surface imaging region and the side surface imaging region in the moving direction of the scan unit is arbitrary. For example, the bottom surface imaging portion and the side surface imaging portion may be disposed to the scan unit so that the both regions substantially coincide with each other. In this case, the scan unit can be formed compact in the moving direction.

Also, both the bottom surface imaging portion and the side surface imaging portion may be formed of line sensors or area cameras. By adopting the configuration as above, the bottom surface image and the side surface image can be taken in a stable manner.

In a case where the component holding member is provided in a plural form and the component holding members are arrayed in line and incorporated into the head unit, it is suitable to provide the guide unit to extend along a direction in which the component holding members are arrayed. This is because adopting the configuration as above makes it possible to perform image recognition of a held condition of all the components by moving the scan unit only once and the image recognition can be performed more efficiently.

Also, a surface mounting machine according to the invention is a surface mounting machine including a head unit incorporating a component holding member capable of holding a component and moving the component holding member between a component supply portion and a substrate, and configured to hold and carry out the component from the component supply portion using the component holding member and mount the component on the substrate after taking an image of the component held by the component holding member and performing image recognition of a held condition of the component. The surface mounting machine is characterized by including the aforementioned component recognizing device provided as means for performing the image recognition of the held condition of the component by the component holding member, and a control device that controls driving of the component holding member when the component is to be mounted on the substrate according to the held condition of the component by the component holding member for which the image recognition has been performed by the component recognizing device.

According to the surface mounting machine configured as above, the component recognizing device described above is provided as means for performing image recognition of a held condition of the component by the component holding member. It thus becomes possible to perform image recognition of a component at a high degree of accuracy in a stable manner over a long term. In addition, because the control device controls the driving of the component holding member according to the image recognition result, it becomes possible to mount a component on the substrate at a high degree of accuracy over a long term.

Further, a component testing machine according to the invention is a component testing machine including a head unit incorporating a component holding member capable of holding a component and moving the component holding member between a component supply portion and a component inspection portion, and configured to hold and carry out the component from the component supply portion using the component holding member and place the component on the component inspection portion to perform a component inspection after taking an image of the component held by the component holding member and performing image recognition of a held condition of the component. The component testing machine is characterized by including the aforementioned component recognizing device provided as means for performing the image recognition of the held condition of the component by the component holding member, and a control device for controlling driving of the component holding member when the component is to be placed on the component inspection portion according to the held condition of the component by the component holding member for which the image recognition has been performed by the component recognizing device.

According to the component testing machine configured as above, the component recognizing device described above is provided as means for performing image recognition of a held condition of the component by the component holding member. It thus becomes possible to perform image recognition of a component at a high degree of accuracy in a stable manner over a long term. In addition, because the control device controls the driving of the component holding member according to the image recognition result, it becomes possible to place a component on the component inspection portion at a high degree of accuracy over a long term.

The invention claimed is:

1. A component recognizing device provided to a head unit incorporating a component holding member capable of holding a component and configured to perform image recognition by taking an image of a held condition of the component by the component holding member, comprising:
   a linear motor having a stator including a bottom frame fixed to a lower portion of the head unit and a plurality of permanent magnets fixed to a bottom surface of the bottom frame, and a mover including a base plate provided at a position downwardly spaced apart from the bottom frame and a coil portion fixed to a top surface of the base plate and located under the permanent magnets;
   a pair of side frames fixed to the bottom surface of the bottom frame and located on opposite sides with respect to the coil portion;
   a pair of guide units having a pair of guide rails each fixed to a bottom surface of the respective side frames to extend in a predetermined moving direction and a pair of sliders each fixed to the top surface of the base plate of the mover and allowed to slide in the moving direction along the guide rail while a movement in a direction orthogonal to the moving direction is limited; and
   a scan unit having an imaging device for taking an image of the component held by the component holding member and fixed to a bottom surface of the base plate of the mover to be allowed to move in the moving direction with respect to the head unit by the guide units;
   wherein the linear motor drives the scan unit in the moving direction by an interaction of magnetic fluxes generated by the stator and the mover while generating an attraction force between the stator and the mover, and
   the stator is fixed to the head unit in a state where a bottom surface of the permanent magnets opposing the coil portion of the mover is faced downward or diagonally downward.

2. The component recognizing device according to claim 1, wherein:
   the component holding member is a suction nozzle that holds the component by sucking a top surface of the component;
   the imaging device has a bottom surface imaging portion that takes an image of a bottom surface of the component; and
   a bottom surface imaging region that can be imaged by the bottom surface imaging portion moves to the bottom surface of the component held by the suction nozzle as the imaging device moves in the moving direction in association with a movement of the scan unit and the bottom surface imaging portion takes a bottom surface image of the component.

3. The component recognizing device according to claim 2, wherein:
   the imaging device has a side surface imaging portion that takes an image of a side surface of the component; and
   a side surface imaging region that can be imaged by the side surface imaging portion moves to the side surface of the component held by the suction nozzle as the imaging device moves in the moving direction in association with a movement of the scan unit and the side surface imaging portion takes a side surface image of the component.

4. The component recognizing device according to claim 3, wherein:
   the bottom surface imaging portion and the side surface imaging portion are disposed to the scan unit in such a manner that the bottom surface imaging region and the side surface imaging region substantially coincide with each other in the moving direction of the scan unit.

5. The component recognizing device according to claim 3, wherein:
   both the bottom surface imaging portion and the side surface imaging portion are formed of line sensors or area cameras.

6. The component recognizing device according to claim 1, wherein:
   the component holding member is provided in a plural form and the component holding members are arrayed in line and incorporated into the head unit; and
   the guide unit is provided to extend along a direction in which the component holding members are arrayed.

7. A surface mounting machine including a head unit incorporating a component holding member capable of holding a component and moving the component holding member between a component supply portion and a substrate, and configured to hold and carry out the component from the component supply portion using the component holding member and mount the component on the substrate after taking an image of the component held by the component holding member and performing image recognition of a held condition of the component, characterized by comprising:
   the component recognizing device set forth in claim 1 provided as means for performing the image recognition of the held condition of the component by the component holding member; and
   a control device that controls driving of the component holding member when the component is to be mounted on the substrate according to the held condition of the component by the component holding member for which the image recognition has been performed by the component recognizing device.

8. A component testing machine including a head unit incorporating a component holding member capable of holding a component and moving the component holding member between a component supply portion and a component inspection portion, and configured to hold and carry out the component from the component supply portion using the component holding member and place the component on the component inspection portion to perform a component inspection after taking an image of the component held by the component holding member and performing image recognition of a held condition of the component, characterized by comprising:
   the component recognizing device set forth in claim 1 provided as means for performing the image recognition of the held condition of the component by the component holding member; and
   a control device that controls driving of the component holding member when the component is to be placed on the component inspection portion according to the held condition of the component by the component holding member for which the image recognition has been performed by the component recognizing device.

* * * * *